United States Patent
Tang et al.

(10) Patent No.: US 8,149,577 B2
(45) Date of Patent: Apr. 3, 2012

(54) SELF-COOLED THYRISTOR VALVE

(75) Inventors: Guangfu Tang, Beijing (CN); Yuanliang Lan, Beijing (CN); Huafeng Wang, Beijing (CN); Hongzhou Luan, Beijing (CN); Zhiqi Li, Beijing (CN); Haiyu Yu, Beijing (CN); Huaxin Wang, Beijing (CN); Jing Zhang, Beijing (CN)

(73) Assignee: China Electric Power Research Institute, Beijing (CN)

( * ) Notice: Subject to any disclaimer, the term of this patent is extended or adjusted under 35 U.S.C. 154(b) by 174 days.

(21) Appl. No.: 12/679,297

(22) PCT Filed: Dec. 18, 2009

(86) PCT No.: PCT/CN2009/001509
§ 371 (c)(1),
(2), (4) Date: Mar. 19, 2010

(87) PCT Pub. No.: WO2010/075669
PCT Pub. Date: Jul. 8, 2010

(65) Prior Publication Data
US 2011/0216518 A1 Sep. 8, 2011

(30) Foreign Application Priority Data

Dec. 31, 2008 (CN) .......................... 2008 1 0247467

(51) Int. Cl.
*H05K 7/20* (2006.01)
(52) U.S. Cl. ........ 361/688; 361/717; 361/820; 361/830; 361/831; 257/714; 363/132
(58) Field of Classification Search ........................ None
See application file for complete search history.

(56) References Cited

U.S. PATENT DOCUMENTS

| | | | |
|---|---|---|---|
| 3,805,140 A * | 4/1974 | Takahashi et al. | 363/141 |
| 3,913,003 A * | 10/1975 | Felkel | 257/665 |
| 4,178,630 A * | 12/1979 | Olsson | 363/141 |
| 4,675,720 A * | 6/1987 | Ikegame et al. | 257/714 |
| 5,870,300 A * | 2/1999 | Blidberg et al. | 363/132 |
| 2006/0232939 A1* | 10/2006 | Inoue | 361/704 |
| 2009/0284922 A1* | 11/2009 | Wang et al. | 361/699 |
| 2011/0134609 A1* | 6/2011 | Folts | 361/717 |

* cited by examiner

*Primary Examiner* — Courtney Smith
(74) *Attorney, Agent, or Firm* — Courtney IP Law; Barbara B. Courtney

(57) ABSTRACT

The present invention relates to a self-cooled thyistor device for ultra-high voltage fault current limiter. a self-cooled thyristor valve, it adopts horizontal structure consisted by frames, frames is divided into upper and below two spaces by crossbeams, the bottom of frames is supported by insulators. There is a cross plate between two vertical said frames, the cross plate mounts resistors connect with a high potential plate and capacitor through two wires. There is a thyistor string in said frame upper space, which is constituted of thyistors and cooler series. The thyistor string is compressed tightly by press-fit mechanism, thyistor string crosses current transformers. There are high potential plates on both sides of the thyistor, the number of the potential plates is equal to that of thyistor. One side of the high potential plates links frames, said current transformers connects with high potential plates. There are capacitors and resistors connected with the bottom plate of said frames in the below space. The small and well-structured invention meets the requirement of the energy on continuous trigger condition, improves the global reliability of thyristor valve.

11 Claims, 11 Drawing Sheets

SELF-COOLED THYRISTOR VALVE

UNITED STATED PATENT APPLICATION FOR RELATED APPLICATIONS

This Application is a United States National Stage Application filed under 35 U.S.C. §371 of PCT Patent Application Serial No. PCT/CN2009/001509 filed on Dec. 18, 2009, which claims the benefit of Chinese Patent Application Serial No. 200810247467.0 filed on Dec. 31, 2008, the disclosures of all of which are hereby incorporated by reference in their entirety.

FIELD OF THE INVENTION

The present invention relates to a thyristor valve, and relates particularly to a self-cooled thyristor valve used for ultra-high voltage fault current limiter.

BACKGROUND OF THE INVENTION

With the development of power systems, novel powers have been increasing into the systems or the subnets connect with each other. This increases the capacity of short circuit of systems. It leads some fault positions current exceed the interrupting capacity of the switches. Generally, the switch is very dear, and renew a switch will take much time; therefore, people always adopt various technical measures to limit the fault current.

The self-cooled thyristor valve which is used for ultra-high voltage fault current limiter (FCL) is a key device in such as resonance FCL, rapid switch FCL, complex FCL and so on. It is mainly used as a rapid switch. FIG. 1 is a resonance FCL working principle diagram. The resonance FCL includes reactor L, capacitor C, and rapid bypass switch K (can adopt thyristor valve, spark gap, rapid mechanical switch and their composition switch). The value of inductive reactance of reactor L is same to that of the capacitive reactance of capacitor C. Under normal working condition, the switch K is off (thyristor valve is blocking), while capacitor C and reactor L are both under the series resonance state, resulting in zero impedance. When a fault current is detected, the switch K will shut down rapid (the thyristor will conduct rapidly), the capacitor C will be bypassed which is equal to connect the reactor L with the electric circuit. So the current will be limited.

Now there have been some flexible thyristors used for alternating current transmission device and direct current transmission device. But in normal condition, a set of complex and expensive cooling system are need due to the long period operation of the thyristor. This reduces the reliability of the entire device. While it needn't resistant long period fault current in abnormal condition, the thyristor must be protected reliably. The present invention meets the requirement of the FCL long period operation under the fault current circumstance, and also improves the operation reliability of entire device because adopts a self-cooled design.

SUMMARY OF THE INVENTION

Preferred embodiments of the present invention seek to overcome the above disadvantages of the prior device and provide a compact, small, and reliable self-cooled thyristor valve.

To achieve above aim, there is provided a self-cooled thyristor valve, it is horizontal structure consisted by frames, said frames is divided into upper and below two spaces by a crossbeam, the bottom of said frames is supported by insulators. There is a cross plate between two vertical said frames, said cross plate mounts resistor, said resistor connects with a high potential plate and capacitor through two wires. There is a thyistor string in said frame upper space, said thyistor is constituted of thyistors connects with cooler one by one, said thyistor string is compressed tightly at two extremities by press-fit mechanism, said thyistor string crosses current transformers, there are high potential plates on both sides of said thyistor, the number of said potential plates is equal to that of said thyistor, one side of the high potential plates links frames, said current transformers connects with high potential plates. There are capacitors and resistors connected with the bottom plate of said frames in the below space. Optical fibers troughs are fixed at the upper space of said frames.

Optimally, there is an optical fiber box on one beside of said frames.

Optimally, the size of said thyistor adopts 6 inches

Optimally, said capacitor adopts damped capacitor, said resistor adopts static equalizing voltage resistor.

Optimally, said frames adopt 10 mm thick epoxy material plates.

Said press-fit mechanism having: a butterfly spring, flange I, guide bar and afterburner mechanism, said butterfly spring, flange I and guide bar connected with flange I are all at one end of thyistor string, and the afterburner mechanism is at another end of thyistor string, said afterburner mechanism includes a briquette and a crown bar, a guide thimble traps the crown bar, a flange II is at the end of the guide thimble, at the end of the flange II, it is covered by a afterburner plate through a afterburner bolt, said crown bar end contacted with briquette is round, and also afterburner plates' end contacted with crown bar; both flange I and flange II are connect with fixed plate.

Said afterburner bolt amount is six, and the six afterburner bolts distributes around the center of the afterburner plate by same interval, said guide thimble and flange II are both positioned through flange and their center line are kept the same.

Said resistor adopts damped resistor. Said damped resistor includes four non-inductive resistors and cases, a top installation hoop is at the top of each non-inductive resistor while a bottom installation hoop is fixed at the lower end, the installation hoops of every two non-inductive resistors are connected through screws to connect parallel with each other, using the screws located the top of the resistors to press wires connected with cases, the screws located the bottom press another two wires, the two wires cross the outlet port of the non-inductive resistor and link respectively high potential plate and capacitor, the surface of said non-inductive resistor is connected with case.

Said cooler adopts heat-pipe cooler. Said heat-pipe cooler has cooler matrix, there are channels in the cooler matrix, the heat pipe couple with channel, there are holes crossing the matrix at both ends of the channels, there two rings on the both sides of said cooler matrix, the cooler is connected with the fixed plate through the rings.

This invention adopted six inches thyristor element, this provides lower thermal impedance and surge current resistance, which is on behalf of the update technology all over the world.

This thyristor valve ensures that it is reliable and the feasible to operating the press-fit mechanism because it is well-structured, convenient to install and needs little preload force, as well as the press-fit mechanism adopted two round contacting surfaces, it ensures its force balance and reliability of the thyristor string during and after been pressed tightly.

This invention thyristor valve adopts inner heat-pipe cooler, this reduces the volume of the cooler because of the structure and it has low-impendence. This meets the rapid absorption requirement of the energy which is produced by the thyristor.

This invention adopts the well-structured damped resistor; this reduces the surface temperature of high dissipation power damped resistor, eliminates the heat element effect to other elements around it, and improves the global reliability of the thyristor.

This invention may meet the requirement to the electromagnetic compatibility in the condition of high magnetic field. This also meets the requirement of the energy to continuous trigger because it adopts the special energy use method mainly provided by voltage few by current.

BRIEF DESCRIPTION OF THE DRAWINGS

Currently preferred embodiments of the invention will now be described with reference to the following attached drawings in which:

FIG. 8 are the schematic diagram of damped resistor,
FIG. 8b is longitudinal sectional view of the cooler.

1—frame, 2—crossbeam, 3—cross plate, 4—resistor, 5—press-fit mechanism, 6—thyristor string, 7—current transformer, 8—high potential plate (TE plate), 9—capacitor, 10—resistor, 11—Optical fibers trough, 12—Optical fibers box, 13—insulator, 14—current transformer coil (CT coil), 15—current transformer iron core;

41—non-inductive resistor, 42—top installation hoop, 43—low installation hoop, 44—screw, 45—screw, 46—case, 47—wire, 47a—active end, 48—wire, 48a—demountable end, 49—outlet port, 410—nut, 411—bolt, 412—outlet port of the wire, 413—cooling hole, 414—bracket, 415—installation bolt, 416—gasket;

51—butterfly spring, 52—flange I, 53—guide bar, 54—briquette, 55—crown bar, 56—guide thimble, 57—flange □, 58—afterburner bolt, 59—afterburner plate, 59a—ball head, 510—fixed plate, 511—flange, 512—screw;

61—thyristor, 62—cooler, 63—cooler matrix, 64—channel, 65—heat pipe, 66—hole, 67—rings, 68—hook;

DETAILED DESCRIPTION OF EMBODIMENTS

The detail of the embodiments is described as below incorporated with the figures by way of cross-reference.

As FIGS. 2-6 shown, a self-cooled thyristor valve, it is horizontal structure consisted by frames 1, frames 1 is divided into top and below two spaces by a crossbeam 2, there are four insulators 13 at the bottom of the frames which is used for supporting the frames. The front and the back frames 1 are welded by triangle aluminum plates; this ensures the structural strength and reduces the weight of the frames.

Figure 1:
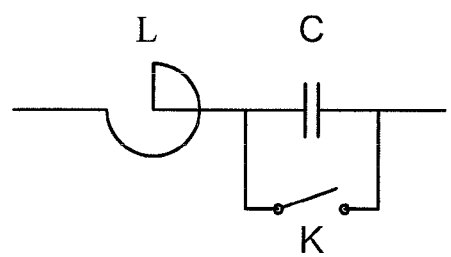
FIG. 1 is a working principle schematic diagram of the FCL.
Figure 2:
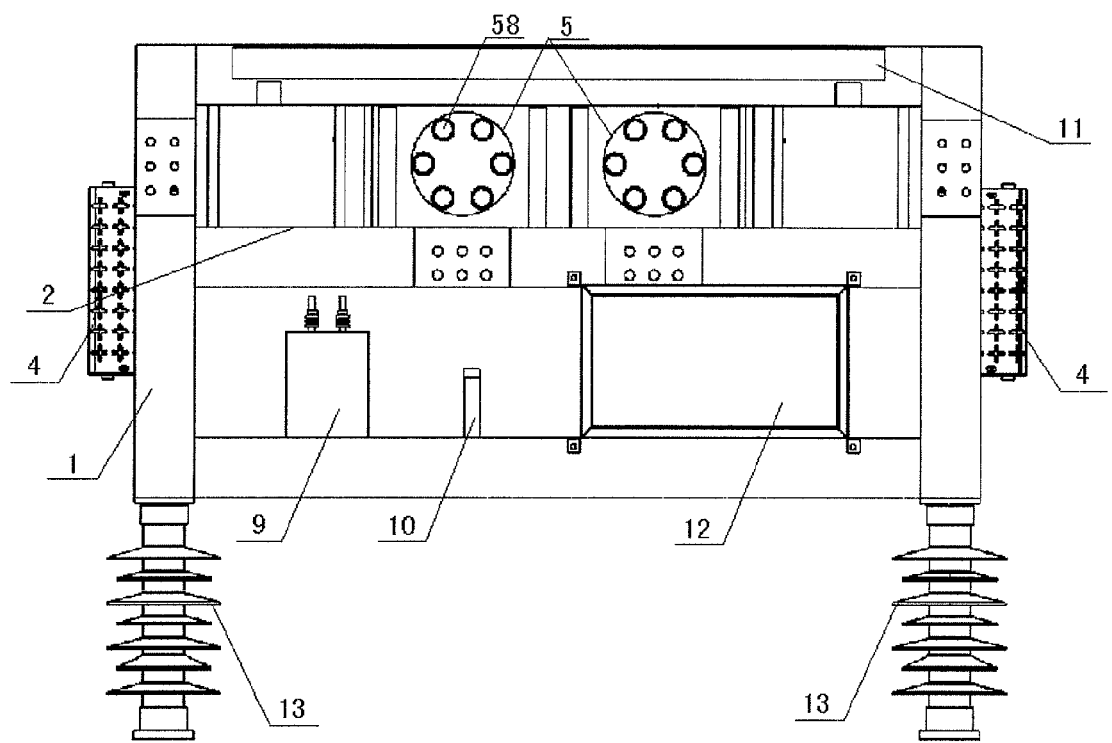
FIG. 2 is the front view of the invention thyristor valve.
Figure 3:
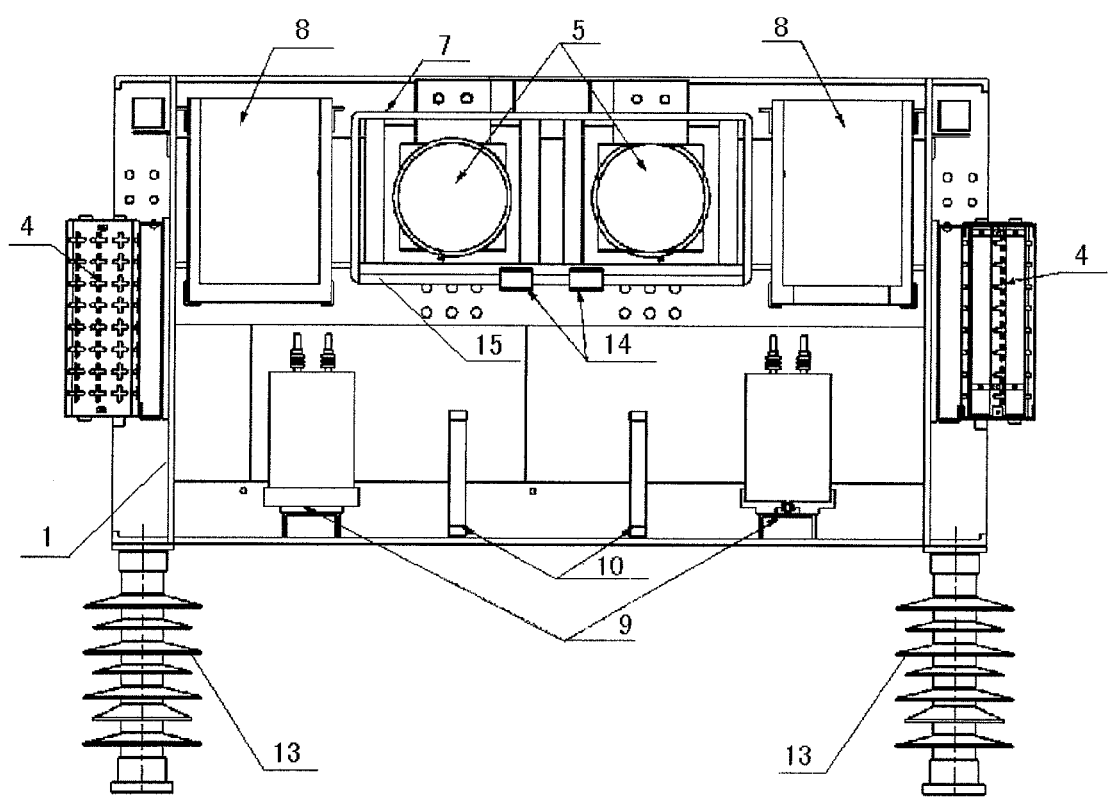
FIG. 3 is the back view of the invention thyristor valve.
Figure 4:
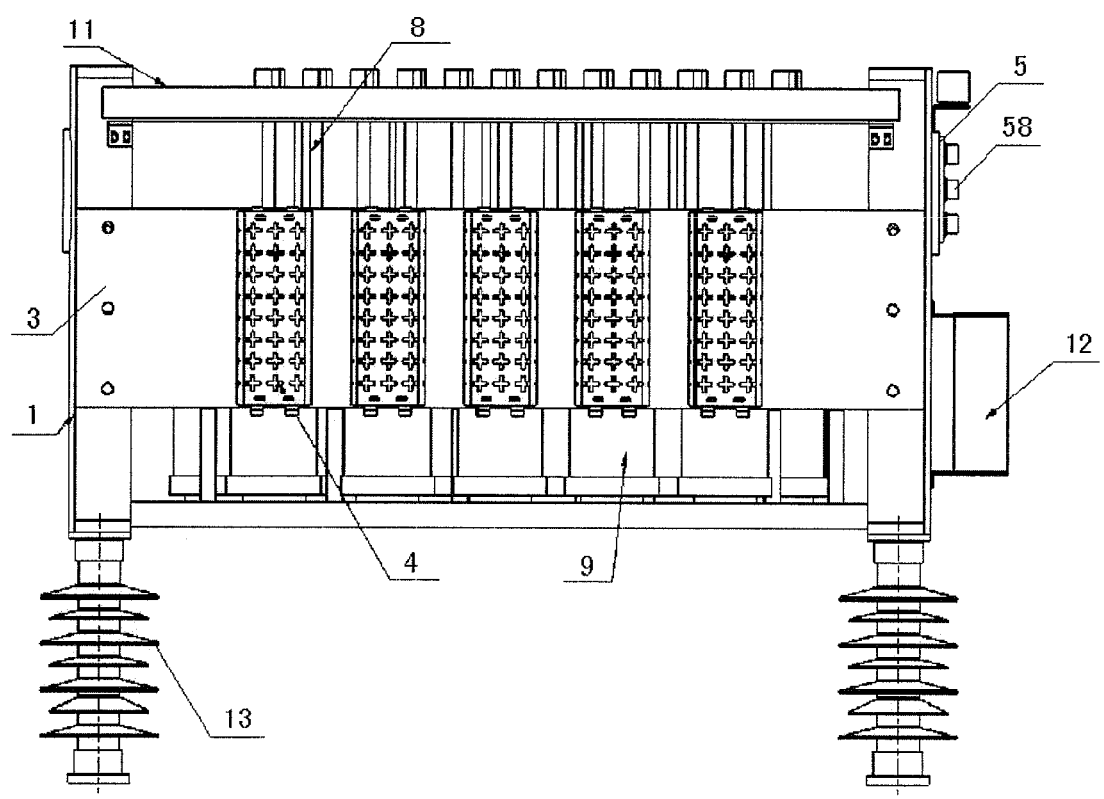
FIG. 4 is the right view of the invention thyristor valve.
Figure 5:
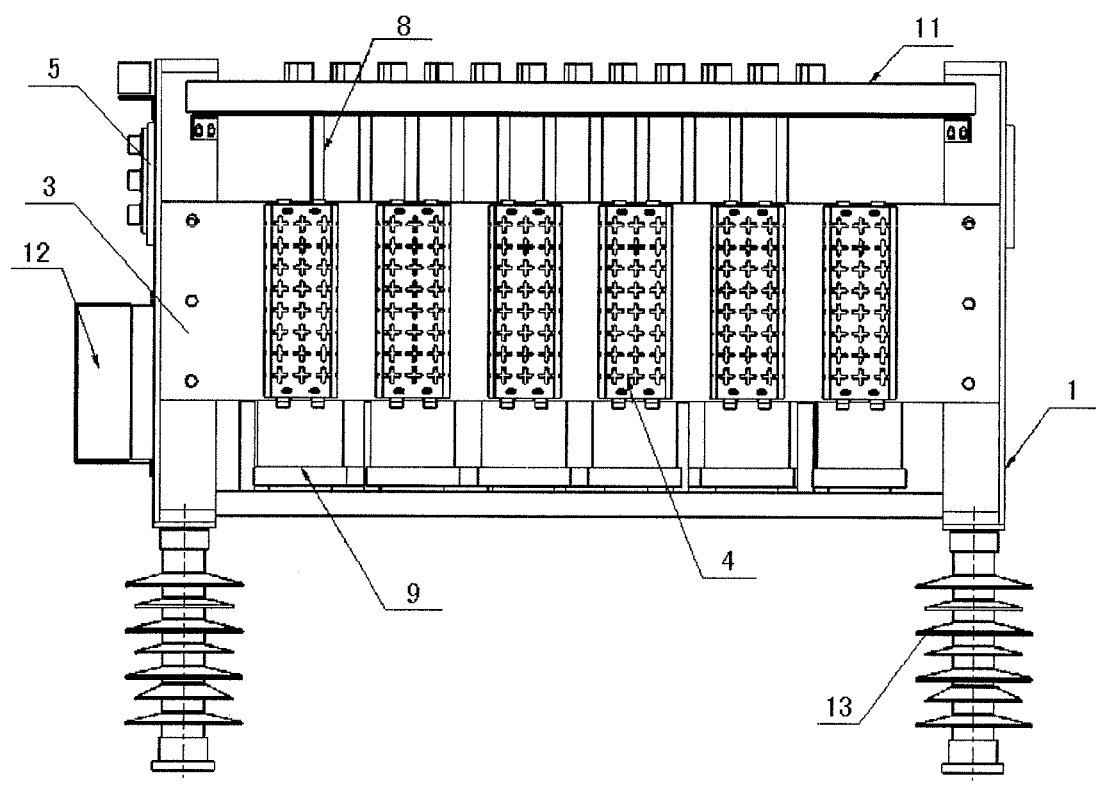
FIG. 5 is the left view of the invention thyristor valve.

There are two thyistor strings 6 in said frame top space, and both of them are installed on the crossbeam 2. Thyistor strings are compressed tightly at two extremities by press-fit mechanism 5. Each thyristor string contains eleven thyistors and twelve cooler, and they arranges interval. The two thyistor strings straightly cross six current transformer iron core 15 of the current transformer coil (CT coil). All of these current transformer coils 7 are arranged around those thyistors, but without contacting them. There are two rows TE plates 8 on the both sides of the thyistors, and the number of each row TE plates is same to that of thyistors. One side of the TE plates is connected with frames 1, while other side is connected with the current transformers. As FIG. 3 shown, each of current transformer iron cores is surrounded by two current transformer coils. Except that two end outlet port wire link to a TE plate ends, other wires of CT coils all connected with the TE plates' ends besides them to provide the energy for lighting the thyistors.

Figure 6:
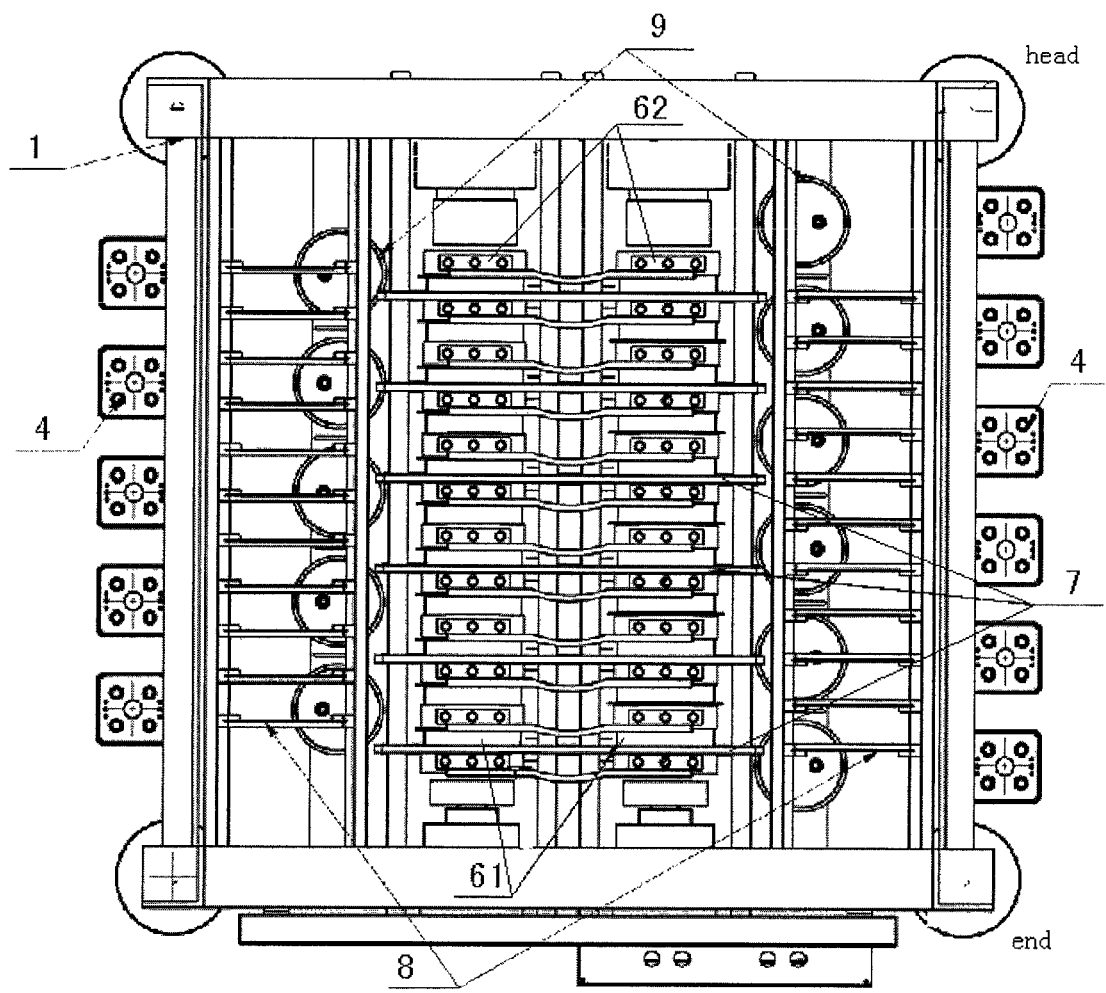
FIG. 6 is the top view of the invention thyristor valve.
Figure 7:
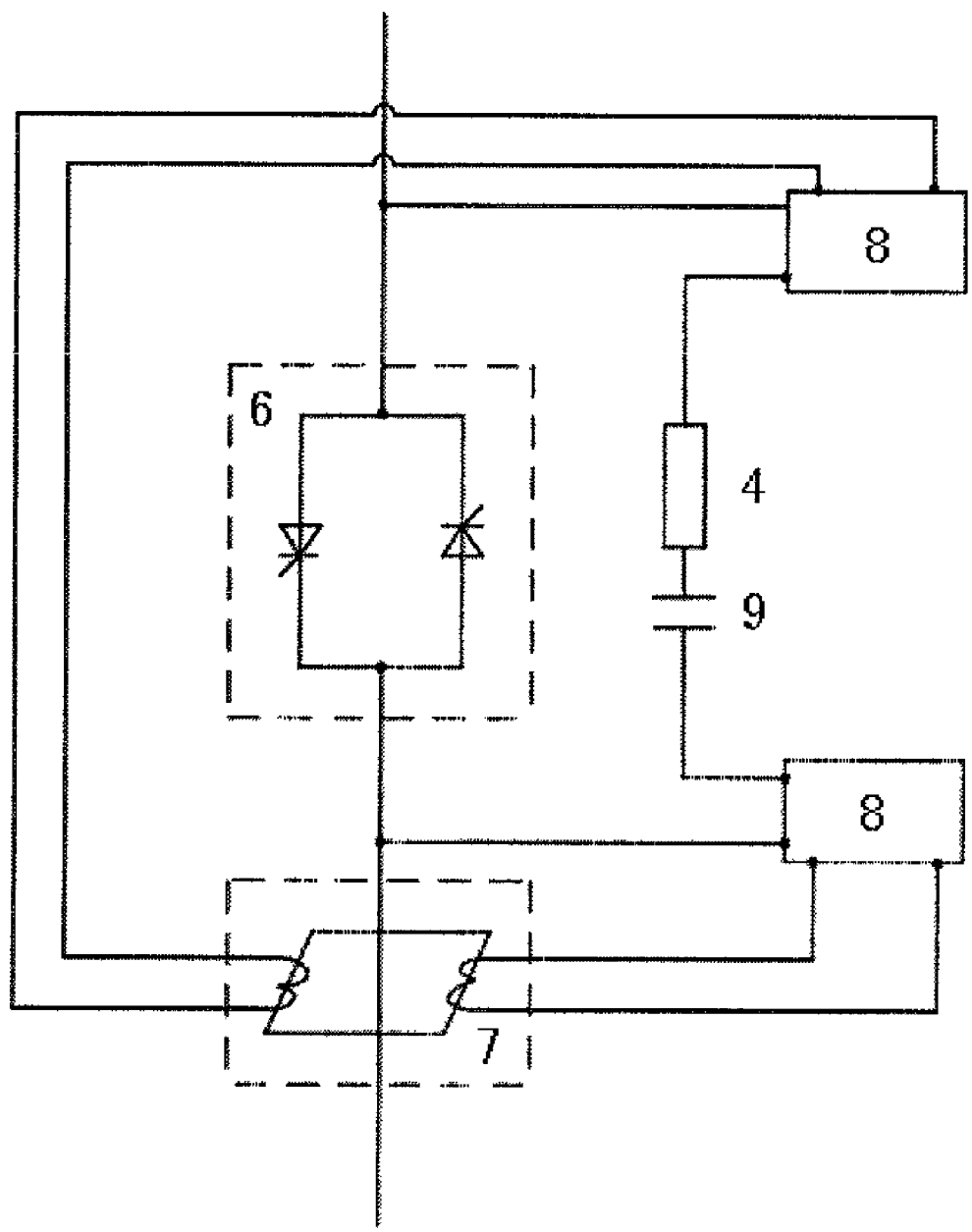
FIG. 7 illustrates the energy adsorption principle of the voltage and current mixture method in the invention device.

There are damped capacitors 9 and static equalizing voltage resistors 10 connected with the bottom plate of said frames in the below space. The number of capacitors and the resistors is both same to that of thyistors. There is a cross plate 3 between two vertical said frames. The damped resistors 4 are riveted on the cross plates 3 through damped resistors 4. As FIG. 6 shown, the damped resistors 4 are installed on the cross plates, and there are five on left cross plates 3, six resistors on right cross plates 3. The damped resistors 4 are coupled with damped capacitors when use, so there are five damped capacitors on the left of frames' bottom plate, and six damped capacitors on the right. As FIG. 7 shown, the two wires out of outlet of the static equalizing voltage resistors 10 is respectively connecting with the ends of damped capacitors and the TE plates. Each of static equalizing voltage resistors 10 is connected with the positive pole of the opposite thyistor and also with the end of the TE plate through two respectively wire.

The optical fiber trough 11 which is installed on the top end of the frames is used for arranging the optical fiber wires of the CTs. This is beneficial to installing and check the circuit, and also eliminates other elements effects to the optical fibers; this improves the stability of the global system. To check and repair the optical fibers conveniently, an optical fiber box 12 is installed at the bottom of the frame for placing the optical fibers.

Figure 8A:
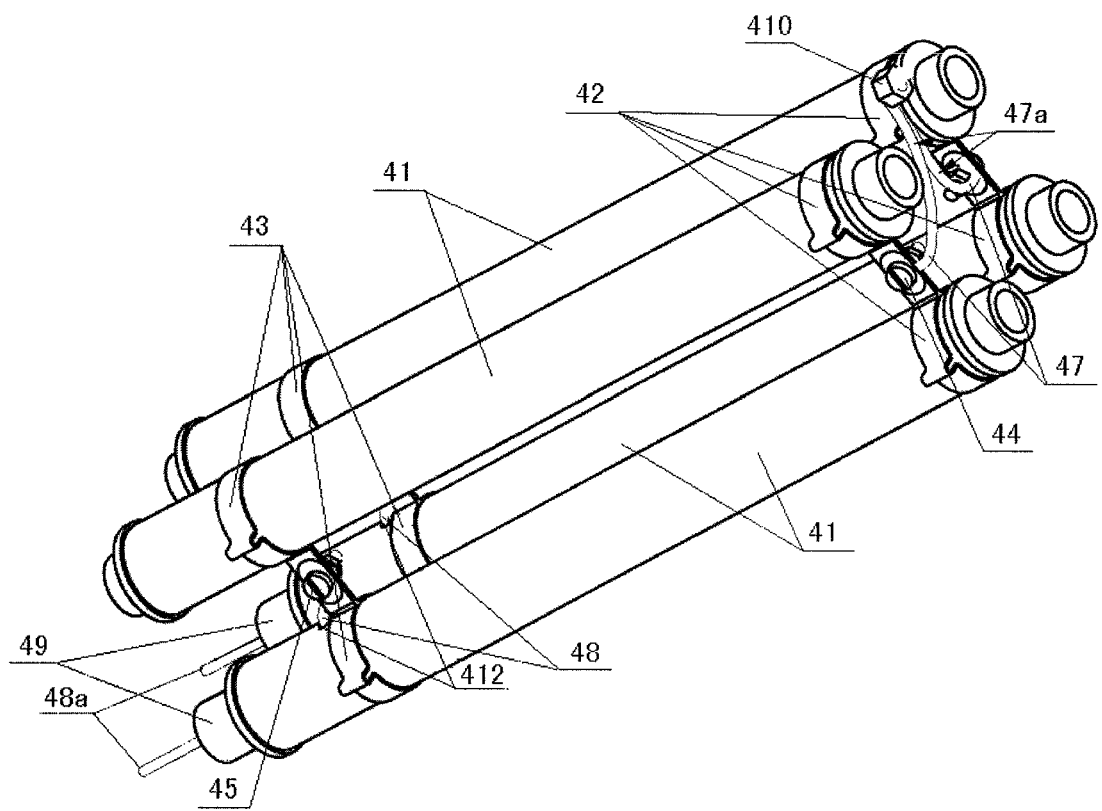
FIG. 8a is the inner schematic diagram.
Figure 8B:
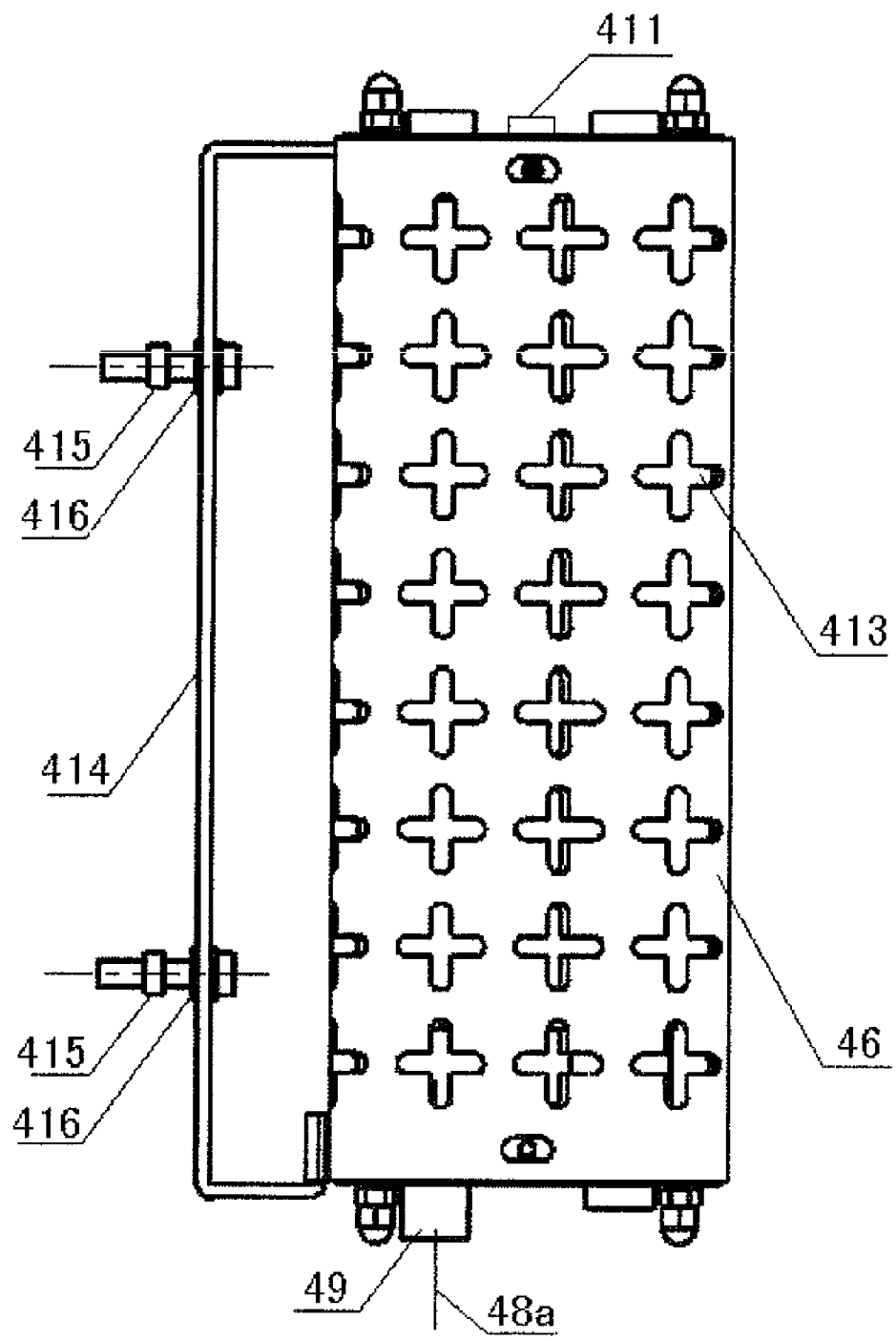
FIG. 8b is the front view of damped resistor.

As FIG. 8a shown, the damped resistors 4 adopts four 200 w, 50Ω non-inductive resistors 41, a top installation hoop is at the top of each non-inductive resistor while a bottom installation hoop is fixed at the lower end, the installation hoops of every two non-inductive resistors are connected through screws to connect parallel with each other. The four resistors are connected parallel every two of them, using the screws located the top of the resistors to press wires connected with cases, the screws located the bottom press another two wires, the active ends 47a of the two wires 47 cross the nut 410, the nut 410 connects with the bolt 411 on the top of the case 46, this connects the case with non-inductive resistors in series after connecting parallel with themselves, this provides the case the equal middle point voltage to non-inductive, therefore, reduce insulation requirement between resistor and the case. The active ends 48a of the two wires 48 crosses a outlet port installed on the non-inductive resistor, and out of the outlet port 49, similarly, another wires' 48 active end 48a also crosses a outlet port 412 installed on a non-inductive resistor. The two wires 48, which are out of the two outlet ports of wire 49, respectively connected with the high voltage potential plate 8 and the damped capacitor 9. As FIG. 8b shown, to reduce the effect of the resistor itself heat to the trigger circuit, a case 46 is set out of the non-inductive resistor. The case adopts the stainless steel and/or copper which have good conductivity. There are some cooling holes 413 on the surface of the case. A bracket is installed on one side of the case; the bracket of the damped resistor is riveted with frame 1 though bolt 415. Besides, between the bracket and the installation bolt a gasket 416, which also adopts the stainless steel and/or copper which have good conductivity, is placed in order to increase the creepage length of the near damped resistors.

Figure 9A:
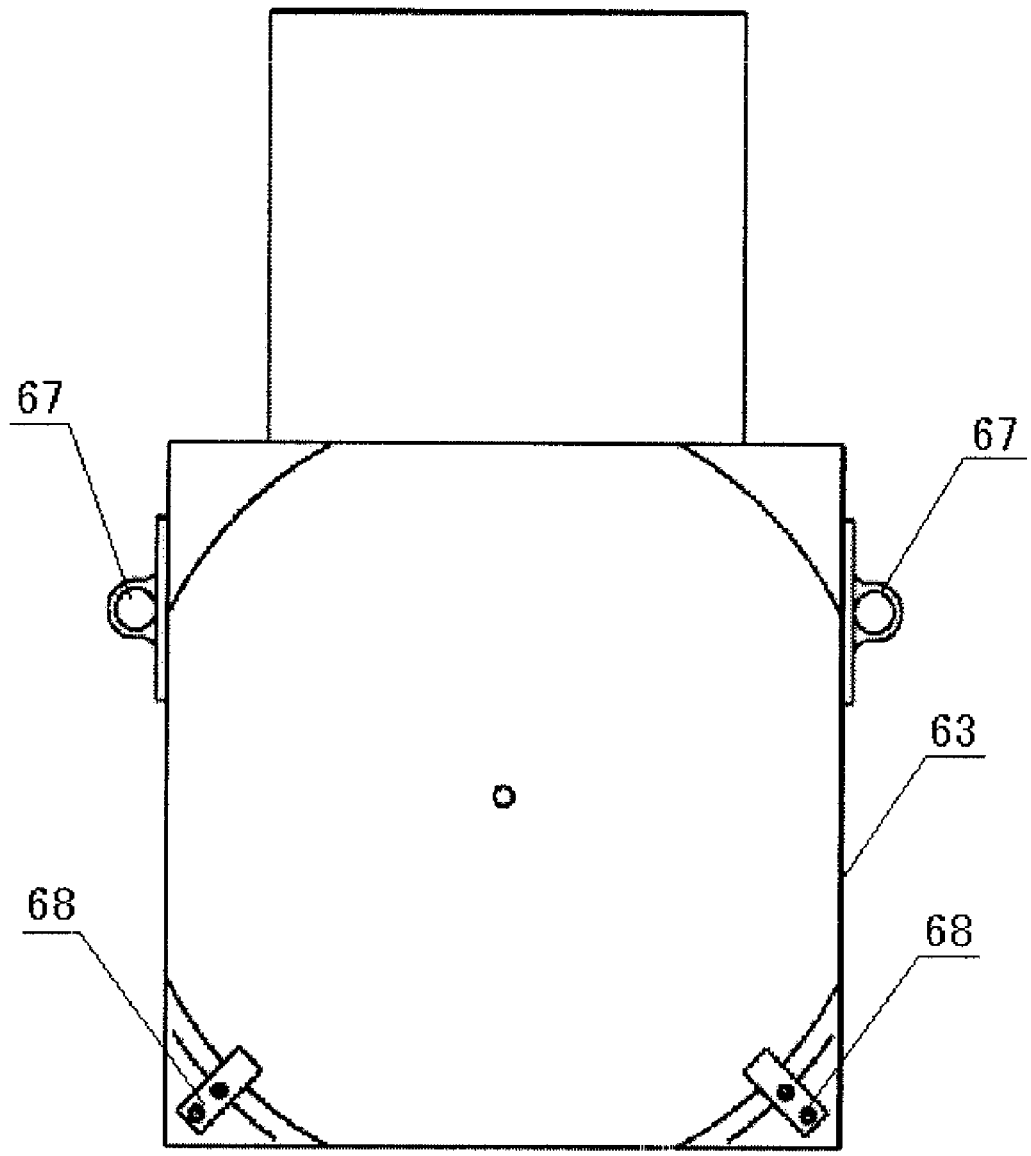
FIG. 9a is front view, FIG. 9b
Figure 9B:
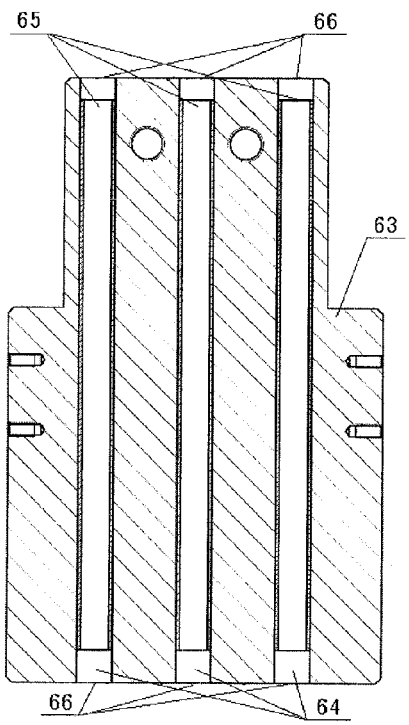
FIG. 9 are the schematic diagram of the cooler.

As FIGS. 9a and 9b shown, said cooler adopts inner heat-pipe cooler, the matrix of the cooler adopts aluminum, it contains up and below two cubic structure, the up is small than the below one. The heat pipe 65 is three straight pipes, there are three channels 64 in the cooler matrix, the three heat pipes couple with three channels, there are holes 63 crossing the matrix at both ends of the three channels 65. This means that there are three holes at the top of the matrix and also there are three holes 66 at the bottom. It is convenient to absorb the heat from the heat pipe and heat transmission. In use the cooler is hanged the TE plate 510 on both sides of the thyristor with the rings 67. To fix thyristor tightly, four hooks can be installed at the bottom of the cooler matrix for hanging the thyristor.

Figure 10:
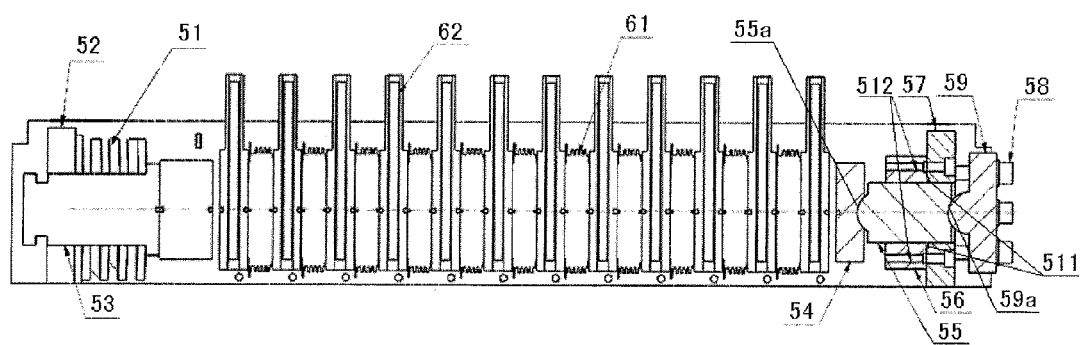
FIG. 10 is the schematic diagram of press-fit mechanism.
Figure 11:
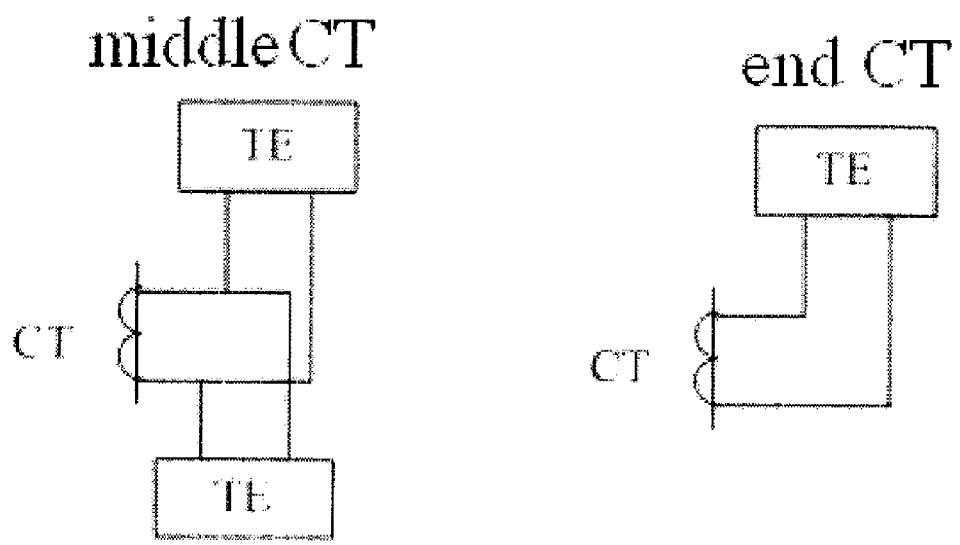
FIG. 11 is the schematic diagram of connecting high potential plate (TE) with current transformer coil (CT)
Figure 12:
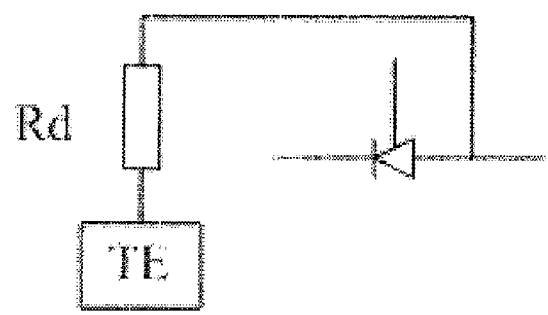
FIG. 12 is the schematic diagram of connecting damped resistor and damped capacitor with the TE plate, in these figures.

As FIG. 10 shown, said press-fit mechanism 5 having: a butterfly spring 51, flange 152, guide bar 53 and afterburner mechanism. Said butterfly spring 51, flange 152 and guide bar 53 connected with flange I are all at one end of thyistor string, and at another end of thyistor string is the afterburner mechanism. Said afterburner mechanism includes a briquette 54 and crown bar 55, a guide thimble 56 traps the crown bar 55. A flange II 57 is fixed at the end of the guide thimble 56 by screws 512, at the end of the flange II 57, it is covered by a afterburner plate 59 through six afterburner bolts 58, the six afterburner bolts 58 distribute around the center of the afterburner plate 59 by same interval. The head of the crown bar 55 contacted with briquette 54 is round, and also afterburner plates' head contacted with the crown bar 55. Both flange I and flange II are connected with fixed plate 510 by screws. Both the guide thimble 56 and flange II 57 is positioned through flange 511 and their center line are kept the same.

As FIG. 7 shown, the invention adopts the special energy use method mainly provided by voltage mixed with current. This means that under thyistor resistor off condition the working current of the TE plate will gain through the bypass if the voltage reaches certain value. On the other hand, the thyistor string can gain the current through the CT coil and transport it to TE plate when the current reaches certain value under the thyistor conductive condition, the TE plate gains working power and gains the energy.

At last, the detail embodiment is one example of the invention but not the only one, so the person in this field must be understand that all the alternatives and other equal and/or similar examples are all within the range of the invention and they are all consistent with the spirits of this invention, are all protected by our claims.

The invention claimed is:
1. A self-cooled thyristor device, comprising:
   a horizontal structure comprising vertical frames (1), wherein said frames are divided into upper and lower spaces by a crossbeam (2), and wherein said frames are supported by insulators (13);
   a cross plate (3) between said frames (1), wherein said cross plate (3) mounts a resistor (4), and wherein said resistor (4) connects with a high potential plate (8) and a capacitor (9) through two wires;
   a thyristor string (6) in said frame upper space, said thyristor string (6) comprising thyristors (61), and connecting with a cooler (62) thyristor-by-thyristor, wherein said thyristor string (6) is compressed tightly at two extremities by a press-fit mechanism (5), and said thyristor string crosses current transformers (7);
   one or more high potential plates (8) on both sides of said thyristors (61), wherein the number of said potential plates (8) is equal to that of said thyristors (61), and wherein one side of the high potential plates (8) links the frames (1), and said current transformers (7) connects with high potential plates (8);
   one or more capacitors (9) connected with the bottom plate of said frames (1) in the lower space;
   one or more and resistors (10) connected with the bottom plate of said frames (1) in the lower space;
   one or more optical fibers troughs (11) fixed at the upper space of said frames (1).

2. A self-cooled thyristor device according to claim 1, wherein said frames (1) fix an optical fiber box (12) on one side of frames (1).

3. A self-cooled thyristor device according to claim 1, wherein said thyristor (61) adopts a six inch thyristor.

4. A self-cooled thyristor device according to claim 1, wherein said capacitor (9) adopts a damped capacitor, and wherein said resistor (10) adopts a static equalizing voltage resistor.

5. A self-cooled thyristor device according to claim 1, wherein said frames (1) adopt one or more 10 mm thick epoxy material plates.

6. A self-cooled thyristor device according to claim 1, wherein said press-fit mechanism (5) comprises:
   a flange I (52);
   a butterfly spring (51) coupled to the flange I (52);
   a-guide bar (53) coupled to the flange I (52), wherein said butterfly spring (51), said flange I (52) and said guide bar (53) are all at one end of the thyristor string (6); and
   an afterburner mechanism at another end of the thyristor string (6), said afterburner mechanism comprises a briquette (54),
   a crown bar (55);
   a guide thimble (56), wherein the guide thimble (56) traps the crown bar (55) wherein an end of the crown bar (55) contacting the briquette (54) is round;
   a flange II (57) at an end of the guide thimble (56);
   an afterburner plate (59) substantially covering an end of the flange II (57) through one or more afterburner bolts (58), wherein an end of the afterburner plate (59) contacts the crown bar (55); and
   a fixed plate (510 coupling the flange I (52) and the flange II (57).

7. A self-cooled thyristor device according to claim 6, wherein said one or more afterburner bolts (58) comprise six afterburner bolts, wherein the six afterburner bolts are distributed around the center of the afterburner plate evenly, and wherein said guide thimble (56) and said flange II (57) are both positioned through a flange (511) such that their respective center lines are substantially the same.

8. A self-cooled thyristor device according to claim 1, wherein said resistor (4) comprises a damped resistor.

9. A self-cooled thyristor device according to claim 8, wherein said damped resistor comprises:
   four non-inductive resistors (41);

a case (46) coupled to a surface of the resistors (41);
a top installation hoop (42) at a top end of each of the non-inductive resistors (41);
a bottom installation hoop (43) fixed at a lower end of each of the non-inductive resistors (41), wherein the installation hoops (42, 43) of every two non-inductive resistors are oriented substantially parallel to each other and connected through screws (44, 45), wherein the screws (44, 45) comprise one or more screws at the top of the resistors to (41) that press one or more wires (47) connected-with the case (46), and one or more screws at the bottom of the resistors (41) that press one or more wires (48), wherein the wires (48) cross an outlet port of the non-inductive resistor (41) and link, respectively, the high potential plate (8) and the capacitor (9).

10. A self-cooled thyristor device according to claim 1, wherein said cooler (62) comprises a heat-pipe cooler.

11. A self-cooled thyristor device according to claim 10, wherein said heat-pipe cooler comprises a cooler matrix (63) comprising one or more of the cooler 62, the cooler matrix (63) further comprising:
   one or more channels (64);
   a heat pipe (65) coupled with each of the one or more channels (64);
   holes (66) crossing the cooler matrix (63) at both ends of each of the channels (64);
   two rings (67) on each side of said cooler matrix (63), wherein each cooler (62) is connected with the fixed plate (510) through the rings (67).

* * * * *